United States Patent
Nakamura

[19]

[11] Patent Number: 6,130,380
[45] Date of Patent: Oct. 10, 2000

[54] SOLAR CELL AND FABRICATION METHOD THEREOF

[75] Inventor: Kazuyo Nakamura, Nara, Japan

[73] Assignee: Sharp Kabushiki Kaisha, Osaka, Japan

[21] Appl. No.: 09/066,822

[22] Filed: Apr. 28, 1998

[30] Foreign Application Priority Data

Apr. 28, 1997 [JP] Japan ..................................... 9-111190
Sep. 10, 1997 [JP] Japan ..................................... 9-245556

[51] Int. Cl.$^7$ ................................................ H01L 31/06
[52] U.S. Cl. ......................... 136/255; 136/258; 136/261; 438/87; 438/96
[58] Field of Search ........................... 136/258 AM, 255, 136/261; 438/83, 87, 96

[56] References Cited

U.S. PATENT DOCUMENTS

| | | | |
|---|---|---|---|
| 4,837,607 | 6/1989 | Kemmer et al. | 357/30 |
| 5,543,333 | 8/1996 | Holdermann | 136/256 X |
| 5,738,732 | 4/1998 | Nakamura et al. | 136/255 |

FOREIGN PATENT DOCUMENTS

| | | | |
|---|---|---|---|
| 0680099A2 | 11/1995 | European Pat. Off. | H01L 31/18 |
| 0693787A2 | 1/1996 | European Pat. Off. | H01L 31/068 |
| 0 735 597 A2 | 10/1996 | European Pat. Off. | H01L 31/068 |
| 8-330611 | 12/1996 | Japan | H01L 31/04 |

OTHER PUBLICATIONS

"An Optimization Study of Si Point–Contact Concentrator Solar Cells," R.A. Sinton et al., 19th IEEE PVSC, 1987, pp. 1201–1208.

"35% efficient nonconcentrating novel silicon solar cell," Jianming Li et al., Appl. Phys. Lett, vol. 60, No. 18, May 4, 1992, pp. 2240–2242.

"A New$^+$PN$^+$Structure with Back Side Floating Junction for High Efficiency Silicon Solar Cells," Moustafa Y. Ghannam, 22nd IEEE PVSC, 1991, pp. 284–289.

*Primary Examiner*—Bernard Codd
*Attorney, Agent, or Firm*—Birch, Stewart, Kolasch & Birch, LLP

[57] ABSTRACT

In a solar cell, a crystal defect layer by ion implantation or an amorphous layer by ion implantation is formed between p type diffusion layers provided in an island-like manner at a side opposite to a light receiving surface of a low concentration p type semiconductor single crystalline substrate. The element of the ion implantation may be at least one selected from the group consisting of hydrogen, silicon, germanium, fluorine, oxygen and carbon. The constituent substance of the semiconductor substrate, such as Si is preferably used for the ion implantation. In such a solar cell structure having the crystal defect or amorphous layer, relatively long wavelength light that could not effectively be utilized in the prior art solar cell may be utilized so that the photoelectric conversion efficiency may be improved.

33 Claims, 8 Drawing Sheets

SOLAR CELL AND FABRICATION METHOD THEREOF

BACKGROUND OF THE INVENTION

1. Field of the Invention

The present invention relates to the improvement of a solar cell and a fabrication method thereof.

2. Description of the Background Art

In general, a conventional solar cell has a structure as shown in FIG. 9, for example. The fabrication process is set forth in the following. In the present specification, the light receiving surface or side is referred to as the front surface or side and the opposite surface or side is referred to as the back surface or side.

As shown in FIG. 9A, a single crystalline silicon substrate (wafer) 100 having a thickness of 30–500 μm and including boron of approximately $1 \times 10^{15}$ cm$^{-3}$ is provided. A polycrystalline silicon substrate may also be used. A p type diffusion layer having high concentration of at least $1 \times 10^{17}$ cm$^{-3}$ is locally formed at the back surface. This portion becomes the local BSF (Back Surface Field) layer. The fabrication method includes the steps of covering the substrate with a mask material 101 such as a silicon oxide film excluding the region at the back surface where a diffusion layer is to be formed, heating the wafer at a temperature of 500–1200° C. in an atmosphere of the mixture of BBr$_3$ gas and oxygen to form an oxide including boron of high concentration all over the wafer, and applying solid-phase diffusion to implant boron of high concentration only into the silicon substrate region at the back surface that is not masked to form p type diffusion layers 102 of high concentration.

Then, as shown in FIG. 9B, the oxide film and the mask material are removed from the surface of the wafer. As shown in FIG. 9C, an n type diffusion layer 103 having a high concentration of at least $1 \times 10^{18}$ cm$^{-3}$ is formed at the front surface. In a similar manner, the back surface is covered with mask material 101. Then, the wafer is heated at the temperature of 500–1200° C. in an atmosphere of the mixture of POCl$_3$ gas and oxygen, whereby an oxide including phosphorous of high concentration is formed all over the surface of the wafer. By solid-phase diffusion therefrom, phosphorous of high concentration is implanted only into the silicon substrate at the front surface that is not masked. As a result, n type diffusion layer 103 is formed. Thus, an n$^+$ diffusion layer 103 is formed at the light receiving surface, and p$^+$ diffusion layers 102 are locally formed at the back surface. After mask material 101 is removed, the surface is entirely covered with a SiO$_2$ film 104.

As shown in FIG. 9D, an N electrode 105 of Ag/Pd/Ti is provided in a comb-like manner at the portion where unnecessary insulation film is removed. At the back surface, a P electrode 106 of Ag/Pd/Ti/Al is formed at the entire back surface. Thus, a local BSF type single crystalline silicon solar cell is produced. FIG. 9E shows a bottom view of this solar cell. FIG. 9F is a sectional view of the solar cell taken along line X-Y of FIG. 9E. Although not illustrated, an anti-reflection coating is provided at the light receiving surface.

When an n type substrate is used, the p type and n type described above are interchanged.

The structure in which a potential gradient from the front surface to the back surface is incorporated by providing an n$^+$/p (or p$^+$/n) junction at the front surface of a p$^-$ (or n$^-$) type substrate and a p$^+$/p$^-$ (or n$^+$/n$^-$) low-high junction at the back surface is a general structure for a silicon solar cell having electrodes located at both surfaces.

A solar cell that has electrodes only at the back surface as shown in FIG. 10 is also known. Such a solar cell is fabricated by the following processes.

As shown in FIG. 10A, a single crystalline silicon substrate (wafer) 100 including low concentration boron of approximately $1 \times 10^{13}$ cm$^{-3}$ with a thickness of 30–500 μm is provided. At the back surface, p type diffusion layers having high concentration of at least $1 \times 10^{17}$ cm$^{-3}$ that become the BSF layer are formed in an island-like manner.

The fabrication method includes the steps of covering both the front surface and the back surface with a mask material 101 such as a silicon oxide film, removing mask material 101 from predetermined portions at the back surface by photolithography and the like, heating the wafer at the temperature of 500–1200° C. in an atmosphere of the mixture of BBr$_3$ gas and oxygen, whereby an oxide including boron of high concentration is formed all over the surface of the wafer. By solid-phase diffusion therefrom, boron of high concentration is implanted only into the portion of the back surface that is not masked to form a p type diffusion layer 102. After removing the oxide and mask material from the surface of the wafer as will be described afterwards, n type diffusion layers having high concentration of at least $1 \times 10^{18}$ cm$^{-3}$ are formed in an island-like manner at the back surface, before an N electrode is formed.

As shown in FIG. 10B, mask material 101 covering both the front and back surfaces is removed from predetermined portions at the back surface. By heating the wafer at the temperature of 500–1200° C. in an atmosphere of the mixture of POCl$_3$ gas and oxygen, an oxide including phosphorous of high concentration is formed all over the surface of the wafer as shown in FIG. 10C. By solid-phase diffusion, phosphorous of high concentration is implanted only into the portion of the back surface that is not masked. Thus, island-like n$^+$ diffusion layers 107 and p$^+$ diffusion layers 102 are provided at the back surface opposite to the light receiving surface.

As shown in FIG. 10D, following removal of unnecessary insulation film, a silicon oxide film 104 is deposited by CVD and the like all over the back surface. A window is formed in the CVD oxide film by photolithography to make contacts with the island-like n$^+$ diffusion layers and p$^+$ diffusion layers. Electrodes of Ag/Pd/Ti/Al are provided at the portion where the window is formed. The electrodes are formed in a comb-like manner, divided into an N electrode that connects the island-like n$^+$ diffusion layers with each other and a P electrode that connects the island-like p$^+$ diffusion layers with each other. FIG. 10E is the bottom view of the wafer prior to formation of the electrodes. FIG. 10F is a sectional view of the wafer after the electrodes are provided, taken along line x-y of FIG. 10E. Then, an anti-reflection coating is formed at the light receiving surface.

The structure in which a potential gradient is incorporated into the substrate by providing an island-like n$^+$/p$^-$ (or p$^+$/n$^-$) junction and a p$^+$/p$^-$ (or n$^+$/n$^-$) low-high junction at the back surface of a p$^-$ or n$^+$ type substrate of low concentration is the general structure of the back surface double electrode contact type solar cell having both electrodes located at one side.

For solar cells which should convert sunlight of low energy density into power, one continuing goal is to improve the photoelectric conversion efficiency thereof. From the standpoint of effective usage of incident energy, there is a problem that long wavelength light is not utilized and lost, though light of the relatively short wavelength portion of the solar energy is substantially entirely converted photoelectrically at the proximity of the light receiving surface of the solar cell.

As an approach of utilizing light of the long wavelength portion, there may be a structure of altering the band gap of the substrate within the solar cell to allow photoelectric conversion lower energy of the long wavelength light.

However, it is generally difficult to alter the band gap within the substrate in a solar cell employing a single crystal based substrate. This is because the band gap in the single crystal having a uniform physical property is essentially uniform everywhere. For the alteration of the band gap, one semiconductor material may be superposed on other semiconductor materials, but there are few such other semiconductor materials that can match in lattice constant and thermal expansion coefficient.

An amorphous semiconductor that can have the physical constant altered rather arbitrarily in the direction of the film thickness includes in the whole film many factors that become the core of minority carrier recombination such as the intra-gap level and grain boundary. In such an amorphous material, the diffusion length of the carrier that greatly affects the conversion efficiency of the solar cell is relatively shorter than that in a single crystal. Therefore, it is expected that high efficiency cannot be achieved in the amorphous material without an epoch-making idea. In conventional art, the film deposition technique for semiconductor materials to have different band gaps is critical. The film is usually grown using CVD. In this case, the choice of material gases and setting the film growing conditions are difficult factors to manage. Furthermore, film formation is sensitive to the state of the substrate. It can be said that growing a film per se has various problems. The film could be grown on the entire processed surface rather than be restricted in a desired region.

SUMMARY OF THE INVENTION

In view of the foregoing, an object of the present invention is to improve efficiency of a solar cell.

In a solar cell and a method of fabricating the solar cell according to the present invention, ion implantation, which can be easily controlled in affected region formation and which is a versatile process, is used to form a layer having a defect or an amorphous layer at the back surface of a semiconductor substrate where a diffusion layer is not formed. This may result in the increase in the efficiency of the solar cell. The implanted substance may be at least one of silicon, germanium, hydrogen, fluorine, oxygen, carbon and the like. Appropriate atoms or molecules are selected depending upon the semiconductor substrate and process.

The present invention is applicable to a solar cell and fabrication method thereof of the following 4 types.

(I) A solar cell including an intrinsic or low concentration p type ($p^-$ type) semiconductor crystal substrate, an n type diffusion layer formed at the light receiving side of the substrate, high concentration p type ($p^+$ type) diffusion layers formed locally at the side opposite to the light receiving side of the substrate, and electrodes connected to respective diffusion layers.

(II) A solar cell including an intrinsic or low concentration p type ($p^-$ type) semiconductor crystal substrate, high concentration p type ($p^+$ type) diffusion layers and an n type diffusion layer which are locally formed and spaced apart at the side opposite to the light receiving side of the substrate, and electrodes connected to these diffusion layers.

(III) A solar cell of type (I) further including an n type diffusion layer present at an electrically floating state at the region between the high concentration p type ($p^+$ type) diffusion layers.

(IV) A solar cell including an intrinsic or low concentration p type ($p^-$ type) semiconductor crystal substrate, an n type diffusion layer formed at the light receiving side of the substrate, high concentration p type ($p^+$ type) diffusion layers and an n type diffusion layer which are locally formed and spaced apart at the side opposite to the light receiving side of the substrate, and electrodes provided at the n type diffusion layers of the light receiving side and the opposite side and at the p type diffusion layers of the opposite side.

According to the present invention, a layer in which a crystal defect is present by ion implantation or an amorphous layer formed by ion implantation is provided in the solar cell of types (I)–(IV). In the solar cell of types (I) and (III), these layers are formed at a region between the high concentration p type ($p^+$ type) diffusion layers. In the solar cell of types (II) and (IV), these layers are formed between the diffusion layers formed at the side opposite to the light receiving side of the substrate.

The advantage of the present invention will be described hereinafter with a solar cell employing a single crystalline silicon substrate as an example.

Numbers of crystal defects can be formed within a crystal by implanting ions of silicon ($^{28}Si^+$), for example, at an appropriate condition into the back side opposite to the light receiving surface and then applying an appropriate heat treatment. An amorphous layer is formed by the continuation of the crystal defects. Such a structure having the defects allows, light of a long wavelength that could previously not be absorbed effectively at the proximity of the light receiving surface and within the bulk, to be converted photoelectrically. The ideal silicon band gap is 1.12 eV. This corresponds to approximately 1.1 $\mu$m when converted into wavelength. In principle, light of a wavelength greater than this wavelength cannot be converted photoelectrically in the solar cell. Light of a longer wavelength passes through outside the cell, or is converted into heat as shown in FIG. 7.

FIG. 7 shows the band of the portion where a defect layer is not present. The light of a short wavelength is represented by $h_\nu > E_g$. Holes excited by the short wavelength arrive at the conduction band. Light of a long wavelength represented by $h_\nu < E_g$ do not contribute to photoelectric conversion. Such light is passing through outside the cell or is converted into heat.

The crystal defect formed at the back side opposite to the light receiving surface according to the present invention locally alters the atomic arrangement of the crystal and disturbs the degeneracy of the electron level to form a trap in the forbidden band of the silicon band gap.

FIG. 8 shows the band of the portion where the defect layer is present. The energy level generated by the defect layer between the conduction band and the valence band functions as a trap. This trap allows the stepping up to the conduction band as shown in FIG. 8 for long wavelength light that could not be absorbed effectively when there was no defect layer. The long wavelength light that is not absorbed by the bulk is absorbed by this defect layer. One photon thereof raises the electron of the valence band to the trap, and the next photon raises the electron at the trap to the conduction band. Photoelectric conversion is effected by this two-stage excitation.

In the present invention, the defect layer is formed, at the region which is proximate to the back surface and has no diffusion layer, by implanting ions into the back surface opposite to the light receiving surface. Therefore, the defect layer does not interfere with the path for the migration of the minority carriers generated within the bulk as shown in FIG. 5. It is known that the crystal defect generally functions as a carrier terminator for minority carriers. In the present invention, however, the disadvantage thereof is low since almost all the carriers generated in the bulk by incident light arrive at the electrode without any influence from the defect layer.

In the system providing both electrodes at the back surface, a diffusion layer of an impurity type reverse to that of the substrate may be formed at the back surface, and the defect layer may be formed within the depletion layer of the junction portion. In such a constitution, a high electric field may be applied to the carrier pair generated at the defect layer to move the carriers quickly, so that recombination at the defect layer can be reduced.

From the standpoint of collecting carriers generated at the defect layer, the back surface double electrode contact type solar cell having both n type and p type diffusion layers formed in an island-like manner at a surface opposite to the light receiving surface employing a substrate of low impurity concentration is advantageous. This is because the site where carriers are generated in the defect layer is located near the electrode which is the collecting site, as shown in FIG. 6.

For the purpose of disturbing the crystal structures, the material element of the substrate or a similar semiconductor material such as Si and Ge may be used. The process margin for forming the defect layer may be reduced since the degree of recovery and formation of crystal defect by heat treatment differs depending upon the heat treatment condition after the implantation. In this case, by implanting hydrogen, fluorine, oxygen or carbon together with the implantation of the semiconductor material, the implanted hydrogen, fluorine, oxygen, or carbon is combined with the dangling bond to become the core of defect. Thus, formation of the defect layer is facilitated.

In addition to the above-described formation of the defect layer by ion implantation, formation of an amorphous layer by ion implantation at a similar position is effective in improving the conversion efficiency.

Although the amorphous layer is at the eventual state of the defect layer increased in the amount of defect, the physical property thereof differs from that of the crystal. For example, silicon has the uniform band gap of 1.1 eV (300K) for a single crystal. The apparent band gap (Tauc gap) of amorphous silicon exhibits a relatively higher level of 1.7–1.8 eV. This value can be varied over a wide range depending upon the formation condition of the amorphous, the amount of hydrogen in the film, and by forming an alloy with various elements such as germanium and oxygen.

Photoelectric conversion of long wavelength light similar to that of the defect layer is carried out taking advantage of the amorphous layer with such a property to improve the conversion efficiency.

Particularly, atoms such as germanium are implanted to form an amorphous layer of a band gap smaller than that of single crystalline silicon at a position similar to that of the defect layer to improve the conversion efficiency of the solar cell by the effect of photoelectric conversion of long wavelength light similar to that of the defect layer.

FIG. 11 shows the band of the portion where an amorphous layer is present, corresponding to FIG. 8. The layer rendered amorphous by ion-implantation of silicon, germanium, and the like has a band gap smaller than that of single crystalline silicon according to the formation condition of the amorphous layer. This layer allows photoelectric conversion of a long wavelength light that cannot be absorbed at the crystal region which is the other portion in the solar cell.

Thus, by means of general ion-implantation process in which formation of affected regions may be easily controlled, a substance identical to or similar to the semiconductor material forming the substrate and/or an element that facilitates defect formation such as hydrogen, fluorine, oxygen, carbon, and the like are implanted to form a defect layer or an amorphous layer at a desired region of a surface opposite to the light receiving surface, whereby light of a wavelength range that could not be effectively absorbed in the bulk may be photoelectric-converted to improve the conversion efficiency of a solar cell.

The foregoing and other objects, features, aspects and advantages of the present invention will become more apparent from the following detailed description of the present invention when taken in conjunction with the accompanying drawings.

Figure 1:
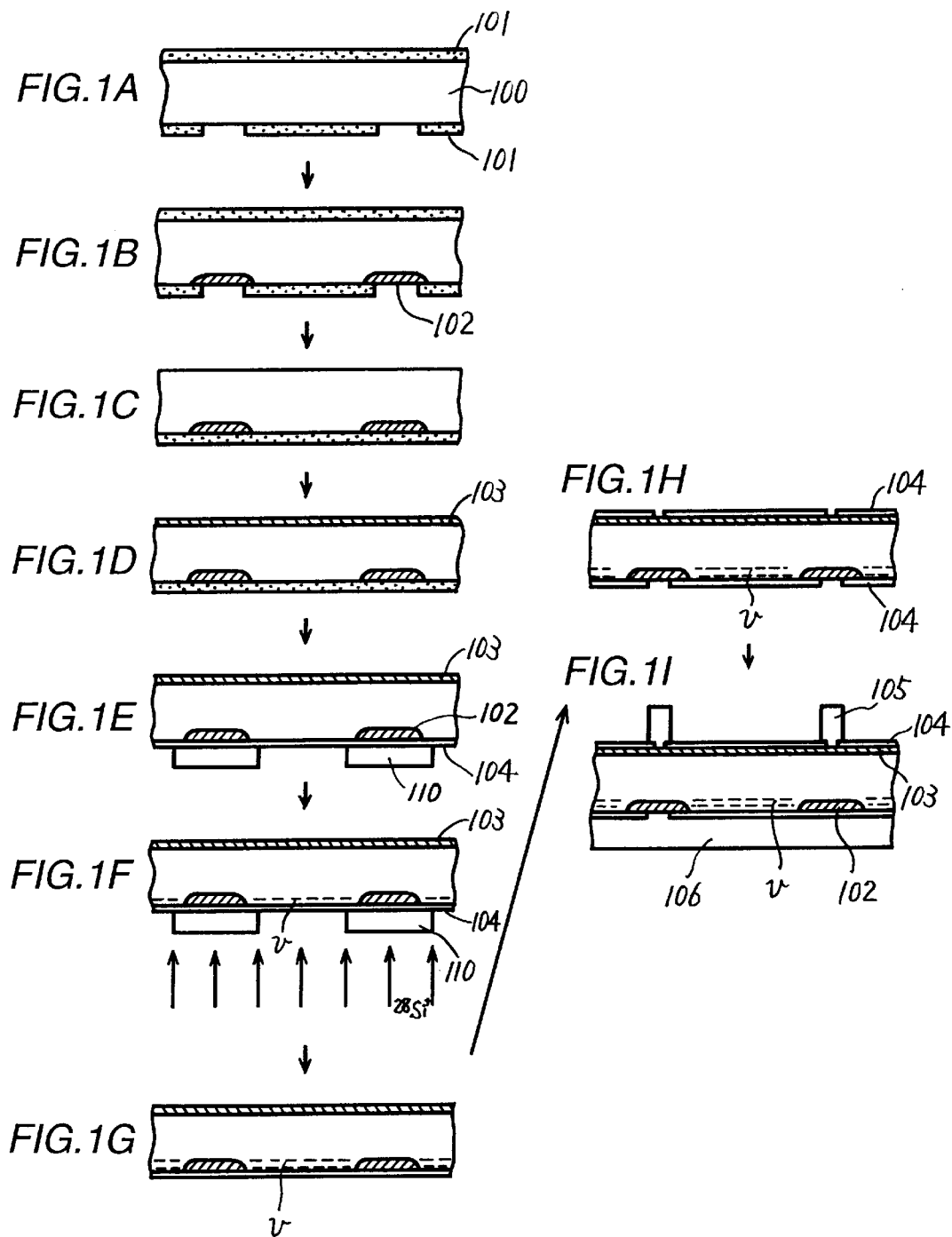
FIGS. 1A–1I are sectional views showing fabrication steps of a solar cell according to a first embodiment of the present invention.

In the drawings, 100 designates a single crystalline silicon substrate; 101 designates a mask material; 102 designates a p type diffusion layer; 103, 107 and 108 designate an n type diffusion layer; 104 designates an oxide film; 105 designates an n electrode; 106 designates a p electrode; 110 designates a resist mask; and v designates a defect layer (or an amorphous layer).

DESCRIPTION OF THE PREFERRED EMBODIMENTS

FIGS. 1A–1I are showing respective steps for fabricating a solar cell according to a first embodiment of the present invention.

As shown in FIG. 1A, a single crystalline substrate (wafer) 100 including boron of approximately $1 \times 10^{15}$ cm$^{-3}$ and having a thickness of 30–500 µm is prepared. At the back surface, p type diffusion layers such as of high concentration p type of at least $1\times10^{17}$ cm$^{-3}$ are locally formed. Both sides of the front surface and the back surface are covered with a mask material 101 such as a silicon oxide film. Holes in the mask material at the back surface are formed in an island-like manner by photolithography and etching technique.

As shown in FIG. 1B, the wafer is heated at the temperature of 500–1200° C. in an atmosphere of the mixture of BBr$_3$ gas and oxygen. An oxide including boron of high concentration is formed all over the surface of the wafer. By solid-phase diffusion therefrom, boron of high concentration is implanted only into the not-masked portion of the silicon substrate at the back surface. As a result, island-like p type diffusion layers 102 are obtained.

Following removal of the oxide and the mask material from the wafer, the back surface is covered with a mask material as shown in FIG. 1C. The wafer is then heated at the temperature of 500–1200° C. in an atmosphere of the mixture of POCl$_3$ gas and oxygen. An oxide including phosphorous of high concentration is formed all over the surface as shown in FIG. 1D. By solid-phase diffusion therefrom, phosphorous of high concentration is implanted into the not-masked portion of the silicon substrate at the front surface. As a result, an n type diffusion layer 103 such as of high density n type of at least $1\times10^{18}$ cm$^{-3}$ is formed all over the front surface.

After the steps requiring heat treatment of a high temperature and prior to the step of forming an electrode, formation of a defect layer of the present invention is carried out. As shown in FIG. 1E, the entire back surface is covered with an implantation protection film such as an oxide film 104. Then, a resist mask 110 having a pattern so as to cover island-like p type diffusion layers 102 at the back surface is formed by photolithography.

As shown in FIG. 1F, silicon ions are implanted into the back surface with the resist as a mask. For example, $^{28}$Si$^+$ ions are implanted at the condition of an energy of 40 keV and a dose level of $2\times10^{15}$ cm$^{-2}$. After the $^{28}$Si$^+$ ion implantation, $^{19}$F$^+$ ions are similarly implanted under the conditions of an energy of 30 keV and a dose level of $5\times10^{14}$ cm$^{-2}$.

Referring to FIG. 1G, following removal of the resist and an appropriate rinsing process, heat treatment for obtaining an optimum defect layer v is carried out. For example, annealing is carried out for 10 minutes at 700° C. under nitrogen gas. The state of the defect layer formed therein can be determined by the ion implantation conditions and the subsequent heat treatment conditions.

The remaining process is similar to that of fabricating a conventional solar cell. As shown in FIG. 1H, both the front and back surfaces are covered with oxide film 104. Windows are formed at required portions. Electrodes 105 and 106 are formed at respective sides of the front and back surfaces. Also, an anti-reflection coating is formed at the light receiving surface. Thus, a solar cell is completed. FIG. 1I is a sectional view of an obtained solar cell.

FIGS. 2A–2H are showing the steps for fabricating a solar cell according to a second embodiment of the present invention. The solar cell of the second embodiment has both the P and N electrodes provided at the back surface.

Figure 2:
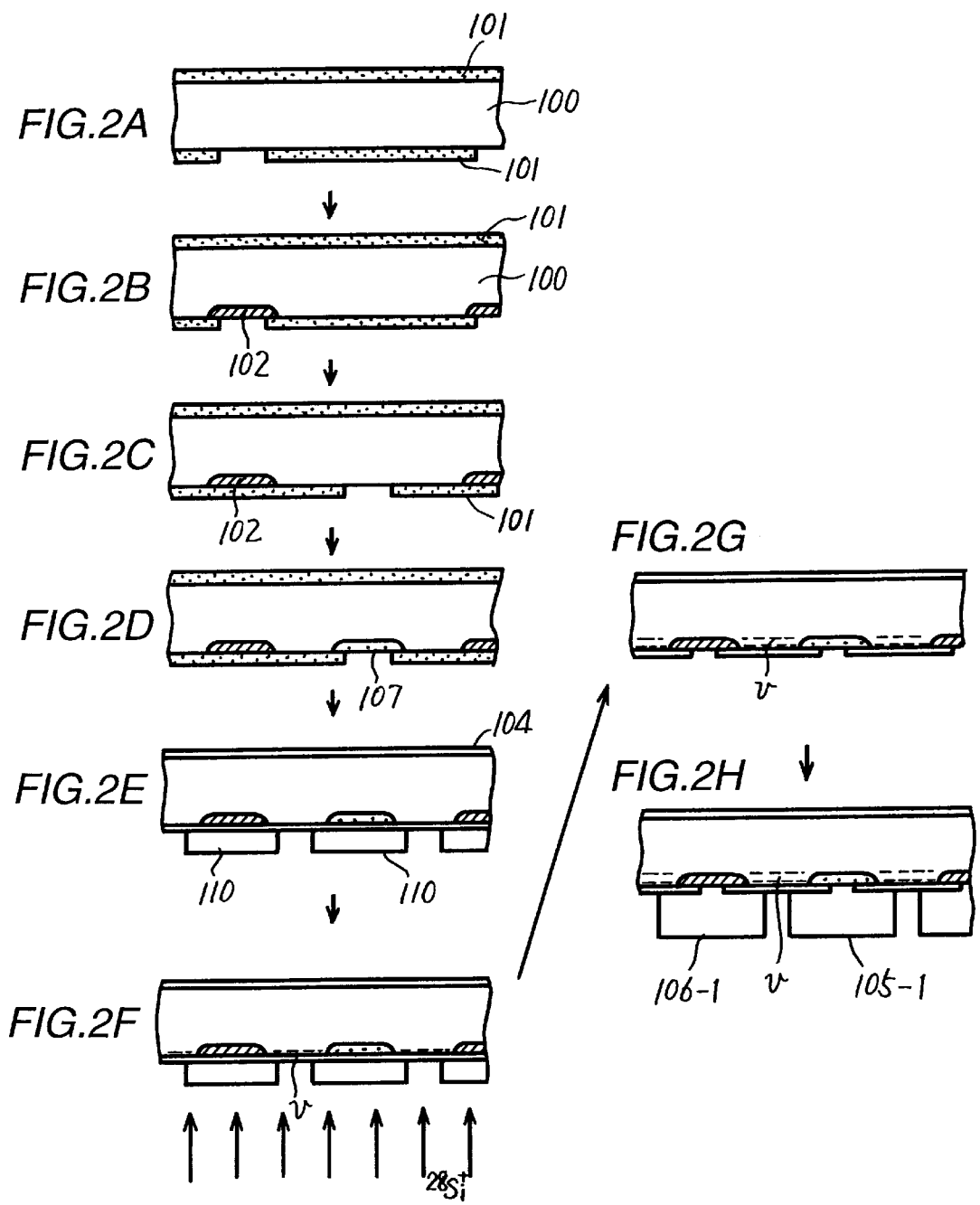
FIGS. 2A–2H are sectional views showing fabrication steps of a solar cell according to a second embodiment of the present invention.

As shown in FIG. 2A, a single crystalline silicon substrate (wafer) 100 having a thickness of 30–500 µm and including low concentration boron of approximately $1\times10^{13}$ cm$^{-3}$ is prepared. At the back surface, high concentration p type diffusion layers of at least $1\times10^{13}$ cm$^{-3}$ are locally formed. Both the sides of the front and back surfaces are covered with a mask material 101 such as a silicon oxide film. Holes are formed in the mask material at the back surface in an island-like manner by photolithography and etching.

As shown in FIG. 2B, the wafer is heated at the temperature of 500–1200° C. in an atmosphere of the mixture of BBr$_3$ gas and oxygen. As a result, an oxide including boron of high concentration is formed all over the surface of the wafer. By solid-phase diffusion therefrom, boron of high concentration is implanted only into the not-masked portion of the silicon substrate at the back surface. As a result, island-like p type diffusion layers are achieved.

As shown in FIG. 2C, following removal of the oxide and mask material from the surface of the wafer, high concentration n type diffusion layers of at least $1\times10^{18}$ cm$^{-3}$ are locally formed on the back surface. In a similar manner, both the front and back surfaces are covered with mask material 101. Then, holes are formed in the mask material at regions excluding the region where the p type diffusion layers are already formed at the back surface.

As shown in FIG. 2D, the wafer is heated at the temperature of 500–1200° C. in an atmosphere of the mixture of POCl$_3$ gas and oxygen. As a result, an oxide including phosphorous of high concentration is formed all over the surface of the wafer. By solid-phase diffusion therefrom, phosphorous of high concentration is implanted only into the not-masked portion of the silicon substrate at the back surface. Thus, n type diffusion layers 107 are obtained in an island-like manner.

After the step requiring heat treatment of high temperature and prior to formation of an electrode, formation of a defect layer of the present invention is carried out. As shown in FIG. 2E, the entire back surface is covered with an implantation protection film. Then, resist mask 110 is formed to cover the island-like p type diffusion layers and n type diffusion layers at the back surface by photolithography.

As shown in FIG. 2F, silicon (Si) is driven by ion implantation to the back surface with the resist as a mask. For example, $^{28}$Si$^+$ ions are implanted under the condition of an energy of 40 keV and a dose level of $2\times10^{15}$ cm$^{-2}$. After the $^{28}$Si$^+$ ion implantation process, $^{19}$F$^+$ ions are implanted under the condition of an energy of 30 keV and a dose level of $5\times10^{14}$ cm$^{-2}$ to form a defect layer v.

As shown in FIG. 2G, resist mask 110 is removed and an appropriate rinsing process is carried out. Then, heat treatment is carried out to achieve an optimum defect layer v. For example, annealing is carried out for ten minutes at 700° C. under nitrogen gas. The state of the defect layer as formed can be determined depending upon the ion implantation conditions and the subsequent heat treatment conditions.

The remaining process is similar to that for a conventional solar cell. Electrodes 105-1 and 106-1 are formed at the surface opposite to the light receiving surface, and an anti-reflection coating is formed at the light receiving surface. Thus, a solar cell is completed. FIG. 2H is a sectional view of the obtained solar cell.

The state of the formed defect layer according to the implantation conditions and heat treatment conditions will be described hereinafter.

By altering the implantation energy of ion implantation, the mean free path of the implanted ions in the semiconductor substrate may change to vary the position (depth) of the formed defect. Also, the spread of ions can be altered in relation with the level of the mean free path. Ions driven at higher energy have a deeper mean position with a larger spread than those driven at a lower energy. Furthermore, the implantation energy greatly contributes to disturb the constituent atom in the semiconductor substrate. The crystal can be rendered amorphous more easily by ion implantation.

Furthermore, the depth and spread can be altered with the same energy by changing the angle of implantation. By setting a larger incident angle (such as approximately 60°) to the direction of the normal to the substrate, a defect can be formed at a more shallow and narrow range (approximately ½ in depth and in spread at 60°) than when implanted perpendicular to the substrate.

The degree of crystal disturbance can be altered by changing the dose level of the ion. A greater dose level renders the implanted portion amorphous. This is also affected by varying the energy of the implanted ions and the mass number. The arrangement of the constituent atoms of the crystal is disturbed more greatly by heavier ion at high energy.

The formed state of the crystal defect is effected by the behaviour of disturbance of the substrate constituent atoms caused by implantation and the subsequent anneal conditions. For example, when $^{28}Si^+$ ions are implanted into the Si substrate, the crystal arrangement is almost recovered by applying annealing at a high temperature of at least 900° C. for more than 10 minutes. The layer that is rendered amorphous sufficiently has the crystal recovered by an anneal process of a relatively low temperature. When annealing at a high temperature of at least 900° C. is initially carried out, a relatively large dislocation loop of several $\mu$ meters is formed unregularly at the proximity of the boundary of the former amorphous layer. When the disturbance of the substrate constituent atoms is small, the crystal is not easily recovered by an anneal process of a low temperature. Although a relatively small defect can be formed uniformly, the crystal will be sufficiently recovered if annealing at high temperature is carried out. In this case, a defect will not be formed.

In this state of affairs, implantation of atoms of a foreign type such as fluorine, oxygen, carbon and the like into the layer where the substrate constituent atoms are disturbed allows formation of a defect with these atoms as the core. The implantation conditions are similar to those described before. The defect formation position can be controlled by varying the implantation energy, implantation angle, and the mass number of the atom. Furthermore, by rendering the region to be implanted sufficiently amorphous in advance, a unique distribution caused by the channeling phenomenon in which small atoms pass through the substrate constituent atoms, is not easily generated even when relatively small atoms are implanted. Thus, the distribution can be controlled more easily.

By a combination of these implantation conditions and obtained phenomenon, a defect layer suitable for a device structure can be obtained. Most of the obtained defect functions as a trap between bands. The cell characteristic (current value) can be improved by providing the defect in a region that does not easily operate as a carrier terminator taking into consideration the travel of the minority carriers.

As a modification of the first embodiment, island-like n type diffusion layers present at an electrically floating state can be formed at the region between the island-like p type diffusion layers formed at the back surface of the semiconductor substrate.

The fabrication method thereof is substantially similar to that of the first embodiment with the exception that the floating junction is formed at the back surface side.

Following the formation of the island-like p type diffusion layers of FIG. 1B, the oxide film and mask material are removed from the surface of the wafer. At the back surface, n type diffusion layers of approximately $1 \times 10^{17}$ cm$^{-3}$ that become the floating junction are formed locally. Then, both the front and back surfaces are covered with a mask material. Holes are formed by photolithography and etching in the mask material in an island-like manner at the region between the p type diffusion layers formed at the back surface. The wafer is heated at the temperature of 500–1200° C. at an atmosphere of the mixture of POCl$_3$ gas and oxygen. As a result, oxide including phosphorous of high concentration is formed all over the wafer. By solid-phase diffusion, phosphorous of high concentration is implanted only into the not-masked portion of the silicon substrate at the back surface. Thus, island-type n type diffusion layers forming the floating junction are achieved.

Figure 3:
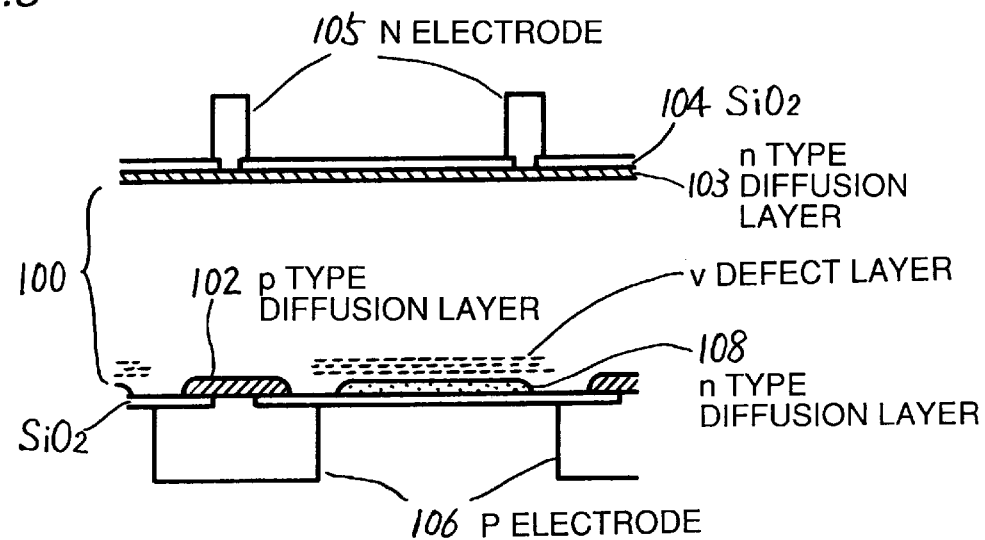
FIG. 3 is a sectional view of a solar cell according to another embodiment of the present invention.

The subsequent process is similar to that of FIGS. 1C and et seq. A sectional view of the obtained state is shown in FIG. 3. 108 designates island-like n type diffusion layers forming the floating junction.

A floating junction cell implies the cell forming the n type diffusion layer in an electrically floating state at the region other than the region forming contact with the p type electrode at the back surface. It is aimed to improve the characteristics by suppressing the cell's dark current taking advantage of the fact that the surface recombination rate at the boundary between the silicon substrate and the oxide film is slower for the n type diffusion layer (refer to 22nd IEEE Photovoltaic Specialists Conference (1991), p. 284). This structure is effective for a cell that has minority carriers of a long lifetime. However, there is no significant difference in the actual solar cells with the conventional structure. In contrast, the present invention is characterized in that a layer where photoelectric conversion is active is formed at the back surface region other than the neighborhood of the p type electrode contact, and therefor more carriers than in the conventional cell arrive at the interface of the oxide film/p type diffusion layer at the back surface. Therefore, the combination with a floating junction structure in the present invention is a significant technique for improving the characteristics. The present invention takes effective advantage of a floating junction structure that was not so effective in application of a conventional cell.

The implantation site is not particularly limited as long as it is at a region other than the p type electrode contact portion (local BSF region) and the floating junction area.

As a modification of the second embodiment of the present invention, an n type diffusion layer can be formed at the front surface to provide an N electrode.

The fabrication method thereof is similar to that of the second embodiment.

After the island-like p type diffusion layers of FIG. 2B are formed, the oxide film and mask material are removed from the surface of the wafer. High concentration n type diffusion layers of at least $1 \times 10^{18}$ cm$^{-3}$ are formed all over the light receiving surface and at local regions of the non-light receiving surface. Then, only the back surface is covered with a mask material. Holes are formed in the mask material by photolithography and etching at the region between the p type diffusion layers formed at the back surface side. The wafer is heated at the temperature of 500–1200° C. in an atmosphere of the mixture of POCl$_3$ gas and oxygen. As a result, an oxide including phosphorus of high concentration is formed all over the surface of the wafer. By solid-phase diffusion therefrom, phosphorous of high concentration is implanted all over the front surface and at predetermined regions at the back surface that are not masked. Thus, n type diffusion layers are obtained.

Figure 4:
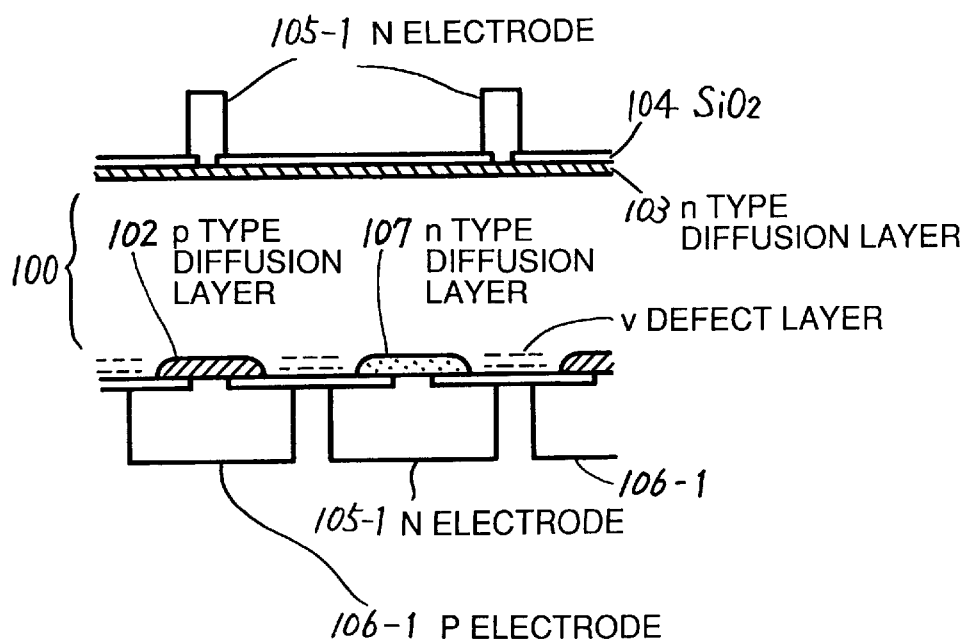
FIG. 4 is a sectional view of a solar cell according to a further embodiment of the present invention.
Figure 5:
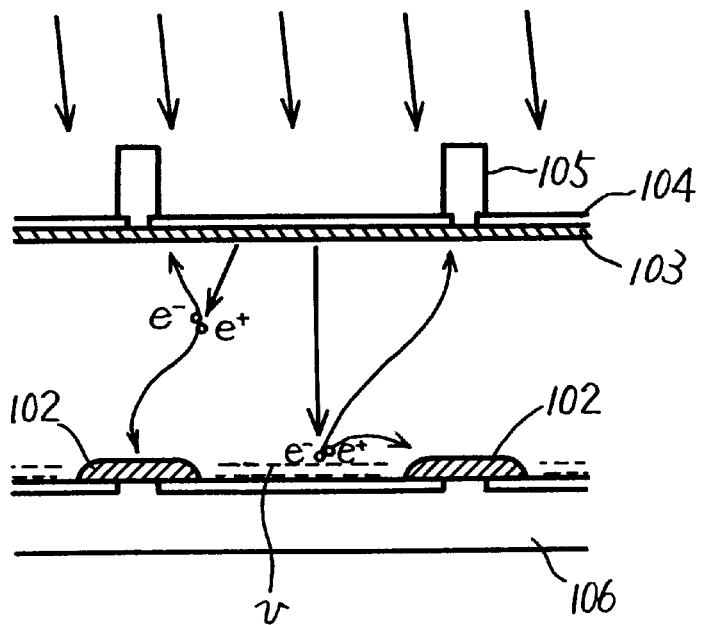
FIGS. 5 and 6 are diagrams for describing the mechanism of the present invention.
Figure 6:
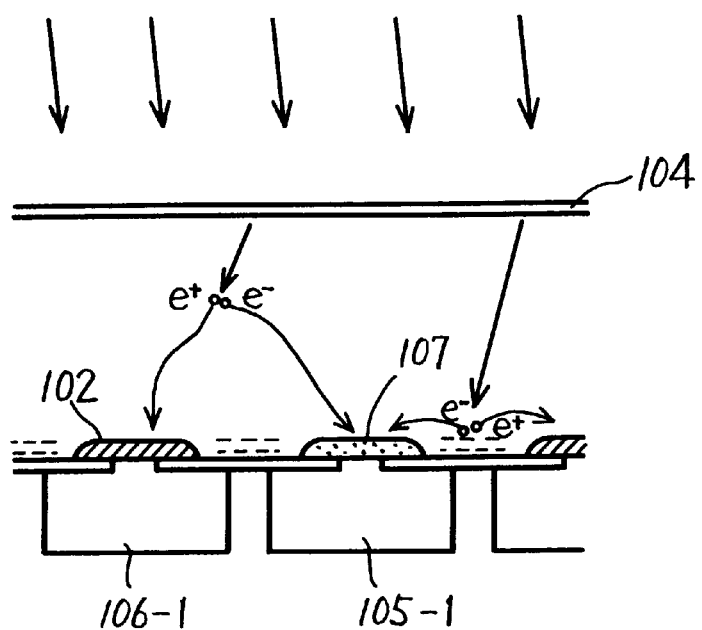
Figure 7:
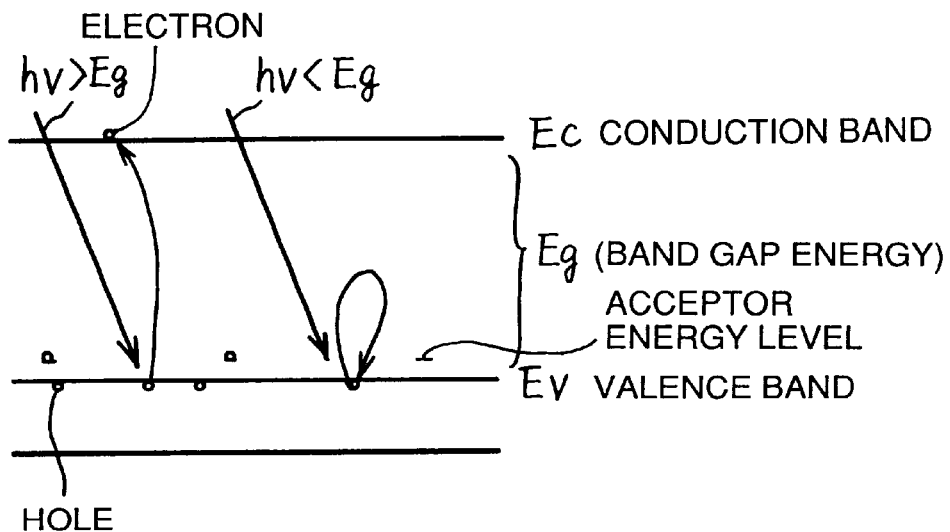
FIG. 7 is a diagram for describing the effect of a conventional solar cell without a defect layer.
Figure 8:
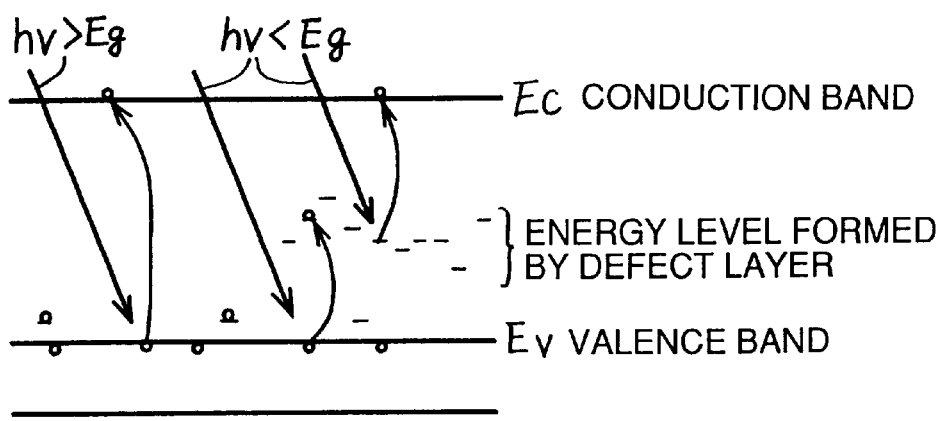
FIG. 8 is a diagram for describing an operation of the solar cell of the present invention with a defect layer.
Figure 9A:
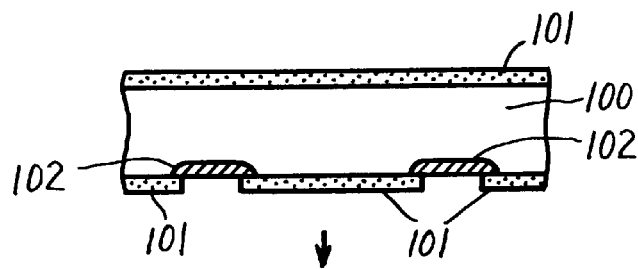
FIGS. 9A–9D and 9F are sectional views showing fabrication steps of one example of a conventional solar cell.
Figure 9B:
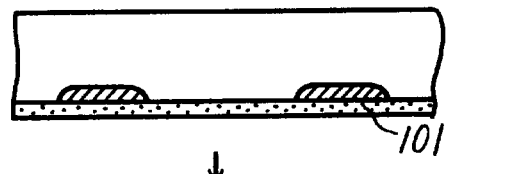
Figure 9C:
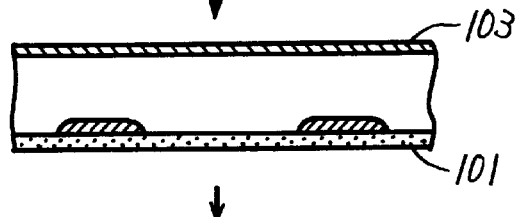
Figure 9D:
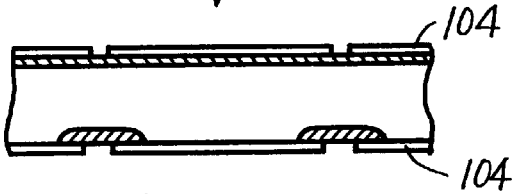
Figure 9E:
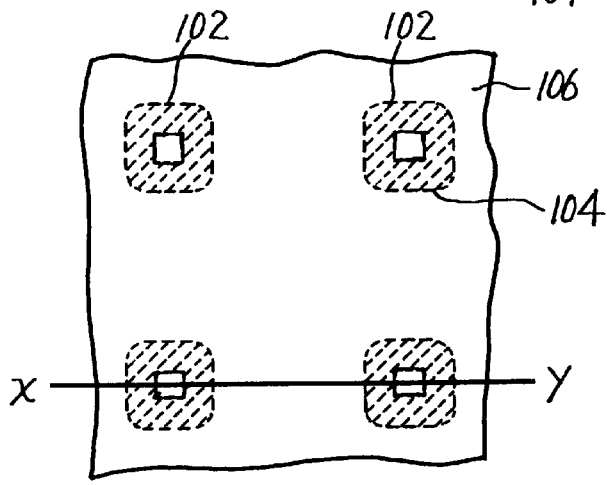
FIG. 9E is a bottom view of the conventional solar cell after the step of FIG. 9D.
Figure 9F:
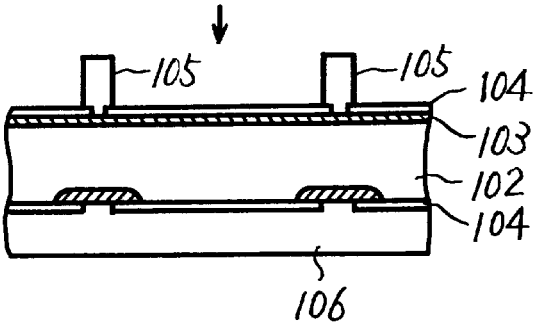
Figure 10A:
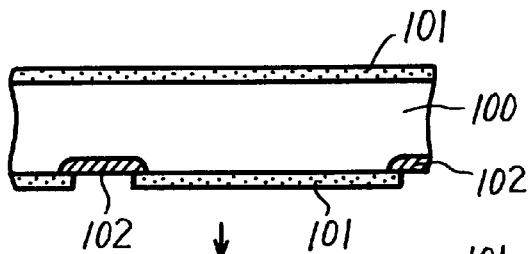
FIGS. 10A–10D and 10F are sectional views showing fabrication steps of another example of a conventional solar cell.
Figure 10B:
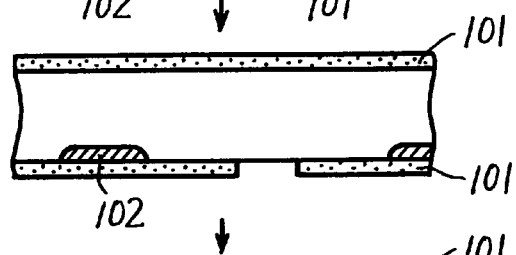
Figure 10C:
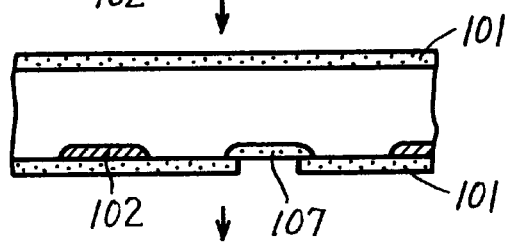
Figure 10D:
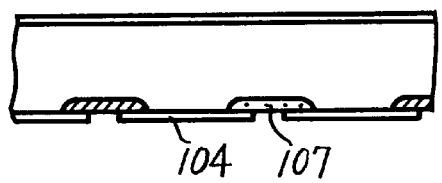
Figure 10E:
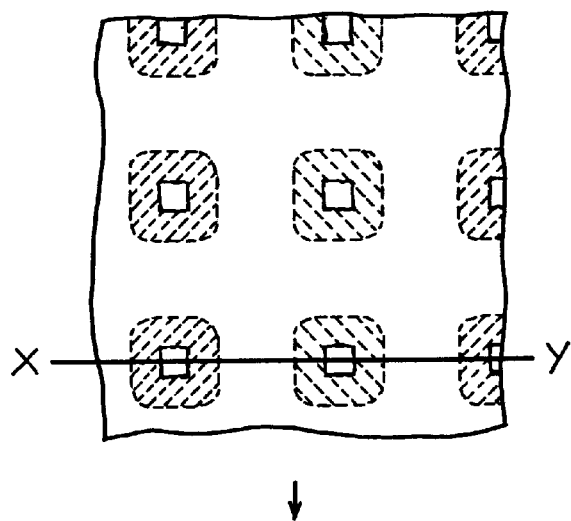
FIG. 10E is a bottom view of the conventional solar cell after the step of FIG. 10D.
Figure 10F:
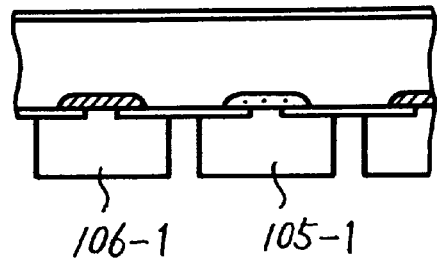
Figure 11:
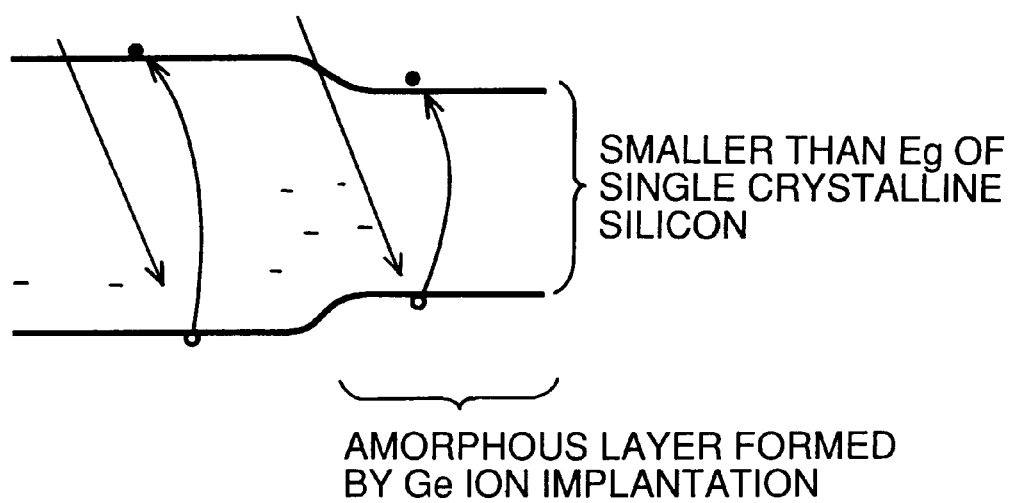
FIG. 11 shows a band of the portion where an amorphous layer is present.

The subsequent processes are similar to those of the second embodiment with the exception that an N electrode is added at the front surface. A sectional view of the obtained state is shown in FIG. 4.

By providing the N electrode at both surfaces, the distance of the minority carriers to the collected site is halved, since the n type diffusion layers connected to the N electrode which is a minority carrier (electron) collector are located at both sides of the front and back surfaces. A shorter distance of travel for minority carriers provides the advantage that the influence of the minority carrier lifetime of the substrate is reduced. Such a structure is useful for making a device in which the performance is not so changed by reduction in the lifetime of the substrate. For example, it is useful for a solar cell such as used in space, in which the lifetime of the substrate may be shortened by something like radiation.

By applying the present invention to a solar cell having electrodes provided at both sides, the number of carriers arriving at both sides of the front and back surfaces becomes greater than those of the conventional solar cell. By providing an n type diffusion layer forming contact with the N type electrode at that region, the carriers arriving thereat can be collected. In addition to the advantage of the structure having n type diffusion layers at both sides, property improvement taking sufficient advantage of the present invention is allowed.

A solar cell of a local BSF structure was described in the above embodiments. Although the present invention is applicable to a structure other than the local BSF structure, many of these other structures have a carrier travel path in the entire non-light receiving surface, and such structures may be easily susceptible to the disadvantage that the defect layer functions as a carrier terminator. Therefore, the effect of the present invention will be reduced in such a case.

Another embodiment will be described hereinafter. A single crystalline silicon substrate having a thickness of 30–500 $\mu$m and including borons of approximately $1 \times 10^{15}$ $cm^{-3}$ is prepared. At the back surface of the substrate, high concentration p type diffusion layers of at least $1 \times 10^{17}$ $cm^{-3}$ are locally formed. This method includes the steps of covering both the front and back surfaces with a mask material such as a silicon oxide film, and forming holes in the mask material in an island-like manner only at the back surface by photolithography and etching.

The wafer is heated at the temperature of 500–1200° C. in an atmosphere of the mixture of $BBr_3$ gas and oxygen. As a result, an oxide including high concentration boron is formed all over the wafer. By solid-phase diffusion therefrom, high concentration boron is implanted only into the not-masked portion of the silicon substrate at the back surface. Thus, island-like p type diffusion layers are obtained.

After the oxide and the mask material are removed from surface of the wafer, a high concentration n type diffusion layer of at least $1 \times 10^{18}$ $cm^{-3}$ is formed all over the front surface. Then, the back surface is covered with a mask material. The wafer is heated at the temperature of 500–1200° C. in an atmosphere of the mixture of $POCl_3$ gas and oxygen. As a result, an oxide including high concentration phosphorous is formed all over the surface of the wafer. By solid-phase diffusion therefrom, high concentration phosphorous is implanted only into the not-masked portion of the silicon substrate at the front surface.

After the process requiring heat treatment at high temperature and prior to formation of an electrode, the amorphous layer according to the present invention is formed. The back surface is entirely covered with an implantation protection film such as an oxide film. Then, a resist mask is formed to cover the island-like p type diffusion layers at the back surface by photolithography. Germanium (Ge) is driven by ion implantation into the back surface with the photoresist as a mask. For example, $^{73}Ge^{+4}$ is implanted at an energy of 100 keV and a dose level of $2 \times 10^{15}$ $cm^{-2}$.

The formation depth of the amorphous layer can be altered by changing the thickness of the oxide film covering the back surface and the implantation energy. The thickness and quality of the amorphous layer can be altered by the implantation energy and dose level. The physical property of the amorphous layer can be altered by the dose level and the type of ion that is implanted.

Then, the resist is removed and an appropriate rinsing process is carried out. A heat treatment of high temperature is not carried out to maintain the amorphous layer.

The subsequent process is similar to that of a conventional solar cell. Electrodes are formed at both sides of the front surface and the back surface. Also, an anti-reflection coating is formed at the light receiving surface. Thus, a solar cell is completed.

By forming the defect layer or amorphous layer at a region opposite to the light receiving surface of the solar cell, light of a wavelength region that could not effectively be absorbed within the bulk can be photoelectric-converted. Therefore, the property of the solar cell can be improved. Also, a solar cell that is stable and highly reliable can be fabricated since ion implantation, which is easy to control and versatile, is used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell comprising:
   a p type semiconductor crystal substrate at a first concentration,
   an n type diffusion layer formed at a light receiving side of said substrate,
   p type diffusion layers at a second concentration formed locally at a side opposite to the light receiving side of said semiconductor substrate,
   a layer having a crystal defect or being amorphous by ion implantation, formed at a region between said locally formed p type diffusion layers, and
   electrodes connected to the respective diffusion layer;
   wherein the second concentration is higher than the first concentration.

2. The solar cell according to claim 1, wherein a substance used for said ion implantation is at least one selected from the group consisting of hydrogen, silicon, germanium, fluorine, oxygen and carbon, and includes at least one of silicon and germanium.

3. The solar cell according to claim 1, wherein said amorphous layer is formed by ion implantation of silicon or germanium at a dose level of at least $3 \times 10^{14}$ $cm^{-2}$.

4. The solar cell according to claim 1, wherein a substance of ion implantation for forming said amorphous layer includes a substance that forms a forbidden band width smaller than the forbidden band width of said substrate.

5. The solar cell according to claim 1, wherein a substance of ion implantation for forming said amorphous layer includes germanium that forms a forbidden band width smaller than the forbidden band width of said substrate when said substrate is a silicon substrate.

6. The solar cell according to claim 1, wherein the substance used for said ion implantation includes silicon and at least one component selected from hydrogen, fluorine, oxygen and carbon.

7. The solar cell according to claim 1, wherein the first concentration is of at least $1 \times 10^{13}$ cm$^{-3}$ of a p type dopant; and the second concentration is at least $1 \times 10^{17}$ cm$^{-3}$ of a p type dopant.

8. A solar cell comprising:

a p type semiconductor crystal substrate at a first concentration, p type diffusion layers at a second concentration and n type diffusion layers, which are locally formed and spaced apart at a side opposite to a light receiving surface of said semiconductor substrate, a layer having a crystal defect or being amorphous by ion implantation, formed between said locally formed diffusion layers, and electrodes connected with respect to the respective diffusion layers at the side opposite to the light receiving surface;

wherein the second concentration is higher than the first concentration.

9. The solar cell according to claim 8, wherein a substance used for said ion implantation is at least one selected from the group consisting of hydrogen, silicon, germanium, fluorine, oxygen and carbon, and includes at least one of silicon and germanium.

10. The solar cell according to claim 8, wherein said amorphous layer is formed by ion implantation of silicon or germanium at a dose level of at least $3 \times 10^{14}$ cm$^{-2}$.

11. The solar cell according to claim 8, wherein a substance of ion implantation for forming said amorphous layer includes a substance that forms a forbidden band width that is smaller than the forbidden band width of said substrate.

12. The solar cell according to claim 8, wherein a substance of ion implantation for forming said amorphous layer includes germanium forming a forbidden band width smaller than the forbidden band width of said substrate when said substrate is a silicon substrate.

13. The solar cell according to claim 8, wherein the first concentration is at least $1 \times 10^{13}$ cm$^{-3}$ of a p type dopant; and the second concentration is at least $1 \times 10^{17}$ cm$^{-3}$ of a p type dopant.

14. A solar cell comprising:

a p type semiconductor crystal substrate at a first concentration, an n type diffusion layer formed at a light receiving side of said substrate, p type diffusion layers at a second concentration formed locally at a side opposite to the light receiving side of said substrate, an n type diffusion layer present in an electrically floating state at a region between said locally formed p type diffusion layers, a layer having a crystal defect or being amorphous by ion implantation, formed at a region between said locally formed p type diffusion layers at the side opposite to the light receiving side, and electrodes connected respectively to said n type diffusion layer at the light receiving side and said p type diffusion layers at the side opposite to the light receiving side;

wherein the second concentration is higher than the first concentration.

15. The solar cell according to claim 14, wherein a substance used for said ion implantation is at least one selected from the group consisting of hydrogen, silicon, germanium, fluorine, oxygen and carbon, and includes at least one of silicon and germanium.

16. The solar cell according to claim 14, wherein said amorphous layer is formed by implanting ions of silicon or germanium at a dose level of at least $3 \times 10^{14}$ cm$^{-2}$.

17. The solar cell according to claim 14, wherein a substance of ion implantation for forming said amorphous layer includes a substance that forms a forbidden band width smaller than the forbidden band width of said substrate.

18. The solar cell according to claim 14, wherein a substance of ion implantation for forming said amorphous layer includes germanium forming a forbidden band width smaller than the forbidden band width of said substrate when said substrate is a silicon substrate.

19. The solar cell according to claim 14, wherein the first concentration is at least $1 \times 10^{13}$ cm$^{-3}$ of a p type dopant; and the second concentration is at least $1 \times 10^{17}$ cm$^{-3}$ of a p type dopant.

20. A solar cell comprising:

a p type semiconductor crystal substrate at a first concentration, an n type diffusion layer formed at a light receiving side of said substrate, p type diffusion layers at a second concentration and n type diffusion layers which are locally formed and spaced apart at the side opposite to the light receiving side of said substrate, a layer having a crystal defect or being amorphous by ion implantation, formed between said locally formed diffusion layers, and electrodes provided respectively at said n type diffusion layers at the light receiving side and at the opposite side, and said p type diffusion layers at the side opposite to the light receiving side;

wherein the second concentration is higher than the first concentration.

21. The solar cell according to claim 20, wherein a substance of ion implantation is at least one selected from the group consisting of hydrogen, silicon, germanium, fluorine, oxygen and carbon, and includes at least one of silicon and germanium.

22. The solar cell according to claim 20, wherein said amorphous layer is formed by implanting ions of silicon or germanium at a dose level of at least $3 \times 10^{14}$ cm$^{-2}$.

23. The solar cell according to claim 20, wherein a substance of ion implantation for forming said amorphous layer includes a substance that forms a forbidden band width smaller than the forbidden band width of said substrate.

24. The solar cell according to claim 20, wherein a substance of ion implantation for forming said amorphous layer includes germanium forming a forbidden band width smaller than the forbidden band width of said substrate when said substrate is a silicon substrate.

25. The solar cell according to claim 20, wherein the first concentration is at least $1 \times 10^{13}$ cm$^{-3}$ of a p type dopant; and the second concentration is at least $1 \times 10^{17}$ cm$^{-3}$ of a p type dopant.

26. A method of fabricating a solar cell comprising the steps of:

forming an n type diffusion layer at a light receiving side of a semiconductor crystal substrate that includes first conductivity type impurities at a first concentration, locally forming p type diffusion layers at a second concentration at an opposite side to the light receiving side of said substrate, forming a layer having a crystal defect or an amorphous layer by ion implantation at a region between said locally formed p type diffusion layers, and forming electrodes respectively to said n type diffusion layer at the light receiving side and to said p type diffusion layers at an opposite side to the light receiving side;

wherein the second concentration is higher than the first concentration.

27. The method of fabricating a solar cell according to claim 26, wherein a substance of said ion implantation is at least one selected from the group consisting of hydrogen, silicon, germanium, fluorine, oxygen and carbon, and includes at least one of silicon and germanium.

28. A method of fabricating a solar cell comprising the steps of:

forming an n type diffusion layer at a light receiving side of a p type semiconductor crystal substrate at a first concentration, locally forming p type diffusion layers at a second concentration at a side opposite to said light receiving side, forming an n type diffusion layer present in an electrically floating state at a region between said locally formed diffusion layers, forming a layer having a crystal defect or an amorphous layer by ion implantation at a region between said locally formed p type diffusion layers, and forming electrodes respectively to said n type diffusion layer at said light receiving side and to said p type diffusion layers at said side opposite to said light receiving side;

wherein the second concentration is higher than the first concentration.

29. The method of fabricating a solar cell according to claim 28, wherein a substance of said ion implantation is at least one selected from the group consisting of hydrogen, silicon, germanium, fluorine, oxygen and carbon, and includes at least one of silicon and germanium.

30. A method of fabricating a solar cell comprising the steps of:

forming an n type diffusion layer at a light receiving side of a p type semiconductor crystal substrate at a first concentration, locally forming p type diffusion layers at a second concentration at a side opposite to said light receiving side, locally forming n type diffusion layers between said locally formed p type diffusion layers, forming a layer having a crystal defect or an amorphous layer by ion implantation at a region between said locally formed p and n type diffusion layers, and forming electrodes to said n type diffusion layer at the light receiving side and said n type diffusion layers and said p type diffusion layers at said side opposite to said light receiving side;

wherein the second concentration is higher than the first concentration.

31. The method of fabricating a solar cell according to claim 23, wherein a substance of said ion implantation is at least one selected from the group consisting of hydrogen, silicon, germanium, fluorine, oxygen and carbon, and includes at least one of silicon and germanium.

32. A method of fabricating a solar cell comprising the steps of:

locally forming type diffusion layers at a second concentration at a side opposite to a light receiving side of a p type semiconductor crystal substrate at a first concentration, locally forming an n type diffusion layer between said locally formed p type diffusion layers, forming a layer having a crystal defect or an amorphous layer by ion implantation at a region between said locally formed p and n type diffusion layers, and forming electrodes respectively to said p type diffusion layers and said n type diffusion layer at said side opposite to said light receiving side;

wherein the second concentration is higher than the first concentration.

33. The method of fabricating a solar cell according to claim 24, wherein a substance of said ion implantation is at least one selected from the group consisting of hydrogen, silicon, germanium, fluorine, oxygen and carbon, and includes at least one of silicon and germanium.

* * * * *